United States Patent
Lai et al.

(10) Patent No.: US 11,462,290 B2
(45) Date of Patent: Oct. 4, 2022

(54) WAFER ACCEPTANCE TEST MODULE AND METHOD FOR A STATIC MEMORY FUNCTION TEST

(71) Applicant: Shanghai Huali Integrated Circuit Corporation, Shanghai (CN)

(72) Inventors: Zhenan Lai, Shanghai (CN); Junsheng Chen, Shanghai (CN); Zhaoying Huang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 229 days.

(21) Appl. No.: 16/901,338

(22) Filed: Jun. 15, 2020

(65) Prior Publication Data

US 2021/0134382 A1    May 6, 2021

(30) Foreign Application Priority Data

Oct. 31, 2019    (CN) .......................... 201911052361.X (51) Int. Cl.
*G11C 29/00*    (2006.01)
*G11C 29/38*    (2006.01)
(Continued)

(52) U.S. Cl.
CPC ............ *G11C 29/38* (2013.01); *G11C 11/418* (2013.01); *G11C 11/419* (2013.01); *H03K 3/0315* (2013.01)

(58) Field of Classification Search
CPC ..... G11C 29/38; G11C 11/418; G11C 11/419; G11C 29/006; G11C 29/12015;
(Continued)

(56) References Cited

U.S. PATENT DOCUMENTS 6,067,262 A * 5/2000 Irrinki ................... G11C 29/12
365/201
6,978,411 B2    12/2005 Huang et al.
(Continued)

FOREIGN PATENT DOCUMENTS

CN    1975934 A    6/2007
CN    101276804 A    10/2008
(Continued)

OTHER PUBLICATIONS

Mar. 24, 2021—(CN) CNIPA First Search Report Appn 201911052361.X.

*Primary Examiner* — Albert Decady
*Assistant Examiner* — Enam Ahmed
(74) *Attorney, Agent, or Firm* — Banner & Witcoff, Ltd.

(57) ABSTRACT

The disclosure discloses a wafer acceptance test module for a static memory function test, reduced instruction built-in self-test circuit formed on a wafer includes: a ring oscillator, a frequency divider, a counter, a data latch and comparator. The counter is used for count, and the count is used as an input signal of each of an address decoder and a data input port at the same time. The data latch and comparator is connected to an output terminal of the address decoder and an output terminal of the sense amplifier and compare two output signals to obtain a test result. The disclosure also discloses a wafer acceptance test method for a static memory function test. The disclosure does not need to rely on a dedicated test machine for memory to perform a static memory function test, which can simplify a test procedure.

9 Claims, 4 Drawing Sheets

(51) Int. Cl.
*G11C 11/418* (2006.01)
*G11C 11/419* (2006.01)
*H03K 3/03* (2006.01)

(58) Field of Classification Search
CPC ... G11C 29/44; G11C 29/56008; G11C 29/56; H03K 3/0315; H03K 5/19
USPC .......................................................... 714/718
See application file for complete search history.

(56) References Cited

U.S. PATENT DOCUMENTS

| | | | | |
|---|---|---|---|---|
| 2004/0073841 A1* | 4/2004 | Toros | ...................... | G11C 29/16 |
| | | | | 714/E11.169 |
| 2008/0298148 A1* | 12/2008 | Nagata | ............. | G11C 29/50012 |
| | | | | 365/201 |
| 2009/0063913 A1* | 3/2009 | Yamasaki | .............. | G11C 29/20 |
| | | | | 714/718 |
| 2009/0161722 A1* | 6/2009 | Gorman | ................. | G11C 29/14 |
| | | | | 374/142 |
| 2009/0319840 A1* | 12/2009 | Hara | .................... | G06F 11/1068 |
| | | | | 714/E11.169 |
| 2009/0327620 A1* | 12/2009 | Arsovski | ............. | G06F 13/4243 |
| | | | | 711/163 |
| 2010/0023809 A1* | 1/2010 | Nakatani | ................ | G11C 29/16 |
| | | | | 714/E11.002 |
| 2013/0275821 A1* | 10/2013 | Braceras | ................ | G11C 29/12 |
| | | | | 714/E11.169 |
| 2015/0127998 A1* | 5/2015 | Veggetti | .................. | G11C 29/52 |
| | | | | 711/167 |
| 2017/0309566 A1* | 10/2017 | Watanabe | ................ | H01L 21/82 |
| 2020/0396090 A1* | 12/2020 | Bellon | .................... | G06F 21/72 |

FOREIGN PATENT DOCUMENTS

| | | |
|---|---|---|
| CN | 101770967 A | 7/2010 |
| CN | 207367924 U | 5/2018 |
| JP | 2003124275 A | 4/2003 |
| WO | 2014045993 A1 | 3/2014 |

* cited by examiner

The present application claims priority to and the benefit of Chinese Patent Application No. CN 201911052361.X filed on Oct. 31, 2019, the disclosure of which is incorporated herein by reference in its entirety as part of the present application.

WAFER ACCEPTANCE TEST MODULE AND METHOD FOR A STATIC MEMORY FUNCTION TEST

CROSS REFERENCE TO RELATED APPLICATIONS

The present application claims priority to and the benefit of Chinese Patent Application No. CN 201911052361.X filed on Oct. 31, 2019, the disclosure of which is incorporated herein by reference in its entirety as part of the present application.

TECHNICAL FIELD

The disclosure relates to the field of semiconductor integrated circuit manufacturing, in particular to a wafer acceptance test (WAT) module for a static memory function test. The disclosure also relates to a wafer acceptance test method for a static memory function test.

BACKGROUND

In the prior art, WAT test equipment cannot perform AC tests, and can only measure DC characteristics of devices. Therefore, functional tests of memories such as the static memory (SRAM) must be performed on custom-designed chips, and can be started until process development is reached to a certain stage. The reasons are as follows.

A suitable Process Development Kit (PDK) for chip SRAM designs is lack.

The small SRAM area is determined by the number of pads. Even if the above problems can be overcome, we only want to perform simple verification, but a relatively large area is needed.

Additional chip designs, hardware, test costs and resources are required.

Figure 1:
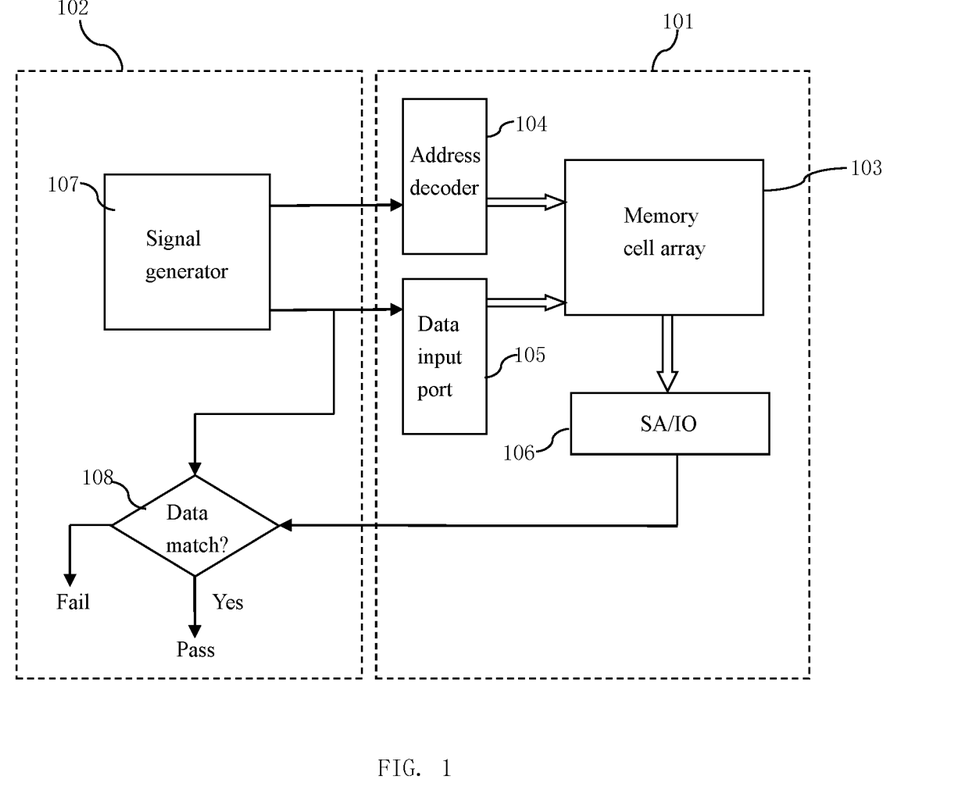
FIG. 1 is a connection diagram of existing static memory function test equipment.

The existing static memory function test usually is performed by Automatic Test Equipment (ATE). As shown in FIG. 1, it is a connection diagram of existing static memory function test equipment; in the existing static memory function test, ATE equipment 102 needs to be used separately, and the static memory is provided on the wafer 101.

The static memory includes a memory cell array 103, an address decoder 104, a data input port 105, a sense amplifier (SA), and an output port (IO) 105.

In the existing method, a signal generator (Signal Generator) 107 in the ATE equipment 102 needs to be used to form an address signal and a data signal, respectively, and the signals are inputted to the address decoder 104 and the data input port 105, respectively.

After the writing is completed, reading is performed. Reading each piece of data is to compare the data signal output from the signal generator 107 with the data signal read from the memory cell array 103 through the sense amplifier and the output port 105. Comparing is to determine whether the two pieces of data match (Data match?), as shown by the reference number 108, if the data is not matched, the signal Fail is output, which indicates that the test fails; if the data is matched, the signal Pass is output, which indicates that the test is successful.

It can be known from the above that the existing method needs to use the ATE equipment 102 to realize the function test of the static memory, the equipment cost is high, and the test procedure is complicated.

BRIEF SUMMARY

The technical problem to be solved by the present disclosure is to provide a wafer acceptance test module for a static memory function test, the module does not need to rely on a dedicated test machine for the static memory function test, can simplify the test procedure for the static memory function test, can also achieve simple and robust testing, can reduce the cost of test equipment and improve test efficiency. The disclosure also provides a wafer acceptance test method for a static memory function test.

In order to solve the above technical problems, the wafer acceptance test module for a static memory function test provided by the present disclosure includes a reduced instruction built-in self-test circuit formed on the wafer and consisting of test patterns, and the reduced instruction built-in self-test circuit is for performing a function test for a static memory formed on the wafer.

The static memory includes a memory cell array, an address decoder, a data input port, and a sense amplifier.

The reduced instruction built-in self-test circuit includes a ring oscillator, a frequency divider, a counter, and a data latch and comparator.

The reduced instruction built-in self-test circuit works under DC voltage provided by wafer acceptance test equipment.

The ring oscillator and the frequency divider are used to form an internal clock signal.

The counter is used for count for the internal clock signal, and the count is used as input signal of each of the address decoder and the data input port; and the most significant bit of the counter is used as a read-write control signal.

The data latch and comparator is connected to an output terminal of the address decoder and an output terminal of the sense amplifier, and the data latch and comparator is used for comparing the output signal of the address decoder and the output signal of the sense amplifier and determine whether the test result is successful based on the comparison result.

A further improvement is that the ring oscillator is formed by connecting an odd number of inverters end to end.

A further improvement is that the counter is formed by connecting n+1 flip-flops, the output signals of the 1 to n-position flip-flops form the n-bit count, and the output signal of the n+1-position flip-flop forms the read-write control signal.

A further improvement is that the flip-flop is a D flip-flop.

A further improvement is that when the output of the data latch and comparator indicates the output signal of the address decoder and the output signal of the sense amplifier are the same, the test result is successful; when the output of the data latch and comparator indicates the output signal of the address decoder and the output signal of the sense amplifier are not the same, the test result is failed.

A further improvement is that when the output signal of the n+1-position flip-flop is 0, the read-write control signal is a write signal, a write operation is performed on the memory cell array under the control of the write signal, and in the write operation, the count is gradually increased from 0 and the data corresponding to the count is sequentially written in the same address as the count.

A further improvement is that when the output signal of the n+1-position flip-flop is 1, the read-write control signal is a read signal, a read operation is performed on the memory cell array under the control of the read signal, and in the read operation, the count is gradually increased from 0 and the data in the same address as the count is sequentially read by the sense amplifier.

A further improvement is that the number of memory cells in the memory cell array is less than or equal to $2^n$.

In order to solve the above technical problems, the wafer acceptance test method for a static memory function test provided by the present disclosure includes: during the manufacturing process of the wafer, when a static memory is formed on the wafer, a step of forming a wafer acceptance test module on the wafer is further included, the wafer acceptance test module includes a reduced instruction built-in self-test circuit formed on the wafer and consisting of test patterns, and the reduced instruction built-in self-test circuit is for performing a function test for a static memory.

The static memory includes a memory cell array, an address decoder, a data input port, and a sense amplifier.

The reduced instruction built-in self-test circuit includes a ring oscillator, a frequency divider, a counter, and a data latch and comparator.

The reduced instruction built-in self-test circuit works under DC voltage provided by wafer acceptance test equipment.

The ring oscillator and the frequency divider are used to form an internal clock signal.

The counter is used for count for the internal clock signal, and the count is used as input signal of each of the address decoder and the data input port; and the most significant bit of the counter is used as a read-write control signal.

The data latch and comparator is connected to an output terminal of the address decoder and an output terminal of the sense amplifier, and the data latch and comparator is used for comparing the output signal of the address decoder and the output signal of the sense amplifier and determine whether the test result is successful based on the comparison result.

A further improvement is that the ring oscillator is formed by connecting an odd number of inverters end to end.

A further improvement is that the counter is formed by connecting n+1 flip-flops, the output signals of the 1 to n-position flip-flops form the n-bit count, and the output signal of the n+1-position flip-flop forms the read-write control signal.

A further improvement is that the flip-flop is a D flip-flop.

A further improvement is that when the output of the data latch and comparator indicates the output signal of the address decoder and the output signal of the sense amplifier are the same, the test result is successful; when the output of the data latch and comparator indicates the output signal of the address decoder and the output signal of the sense amplifier are not the same, the test result is failed.

A further improvement is that when the output signal of the n+1-position flip-flop is 0, the read-write control signal is a write signal, a write operation is performed on the memory cell array under the control of the write signal, and in the write operation, the count is gradually increased from 0 and the data corresponding to the count is sequentially written in the same address as the count.

A further improvement is that when the output signal of the n+1-position flip-flop is 1, the read-write control signal is a read signal, a read operation is performed on the memory cell array under the control of the read signal, and in the read operation, the count is gradually increased from 0 and the data in the same address as the count is sequentially read by the sense amplifier.

In the present disclosure, by providing the reduced instruction built-in self-test circuit consisting of test patterns on the wafer, the wafer acceptance test module for a static memory function test can be formed, so that the static memory can be tested by using wafer acceptance test equipment which can only provide DC voltage, so as to not rely on a dedicated test machine for memories to perform the static memory function test, thereby simplifying procedures for the static memory function test, enabling simple and stable testing and reducing test equipment costs, and the circuit is simple and can run stably, further improving test efficiency.

BRIEF DESCRIPTION OF THE DRAWINGS

The present disclosure is described in further detail below with reference to the drawings and specific embodiments.

DETAILED DESCRIPTION

Figure 2:
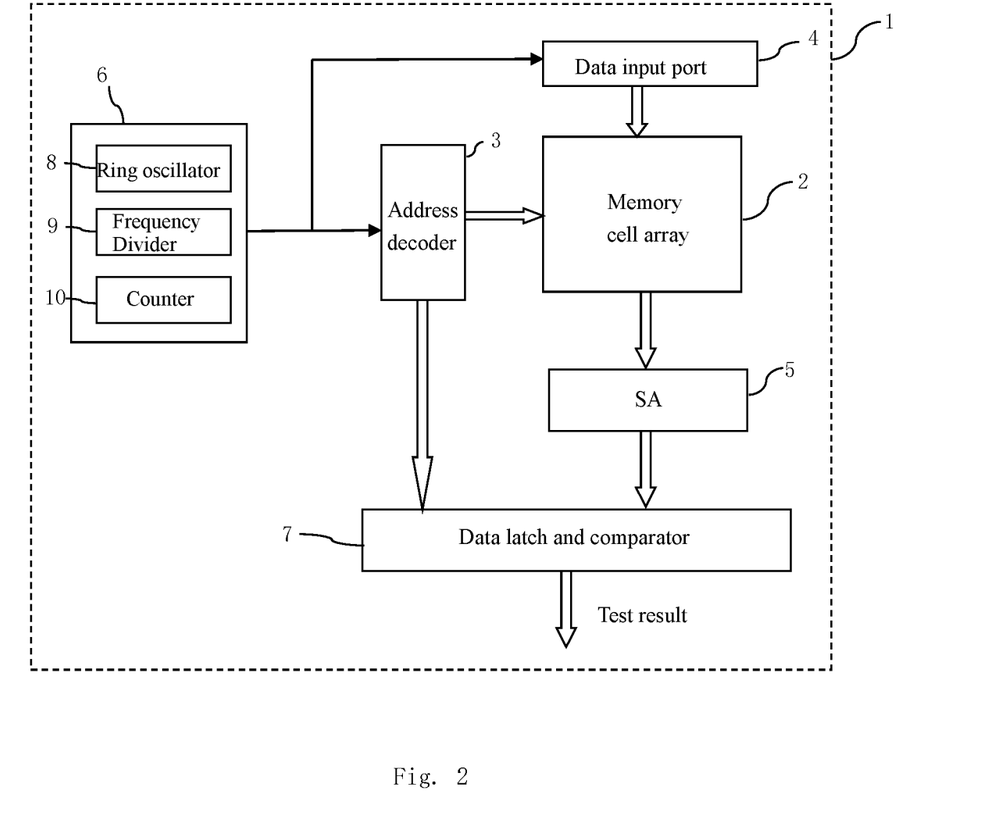
FIG. 2 is a structural diagram of a wafer acceptance test module for a static memory function test according to an embodiment of the present disclosure.

As shown in FIG. 2, it is a structural diagram of a wafer acceptance test module for a static memory function test according to an embodiment of the present disclosure; the wafer acceptance test module for a static memory function test according to an embodiment of the present disclosure includes a reduced instruction built-in self-test circuit formed on a wafer 1 and consisting of test patterns, and the reduced instruction built-in self-test circuit is for performing a function test for a static memory formed on the wafer 1.

The static memory includes a memory cell array 2, an address decoder 3, a data input port 4, and a sense amplifier 5.

The reduced instruction built-in self-test circuit includes a ring oscillator 8, a frequency divider 9, a counter 10, and a data latch and comparator 7, wherein the circuit structure consisting of the ring oscillator 8, the frequency divider 9 and the counter 10 is indicated by the reference numeral 6 alone.

The reduced instruction built-in self-test circuit works under DC voltage provided by wafer acceptance test equipment.

The ring oscillator 8 and the frequency divider 9 are used to form an internal clock signal CLK.

The counter 10 is used for count for the internal clock signal CLK, and the count is used as input signals of the address decoder 3 and the data input port 4 at the same time; and the most significant bit of the counter 10 is used as a read-write control signal R/W Control.

The data latch and comparator 7 is connected to the output terminal of the address decoder 3 and the output terminal of the sense amplifier 5. The data latch and comparator 7 is used for comparing the output signal of the address decoder 3 and the output signal of the sense amplifier 5 and determine whether the test result is successful based on the comparison result.

In the present disclosure, by providing the reduced instruction built-in self-test circuit consisting of test patterns on the wafer 1, the wafer acceptance test module for a static memory function test can be formed, so that the static memory can be tested by using wafer acceptance test equipment which can only provide DC voltage, so as to not rely on a dedicated test machine for memories to perform the static memory function test, thereby simplifying procedures for the static memory function test, enabling simple and stable testing and reducing test equipment costs, and the circuit is simple and can run stably.

Figure 3:
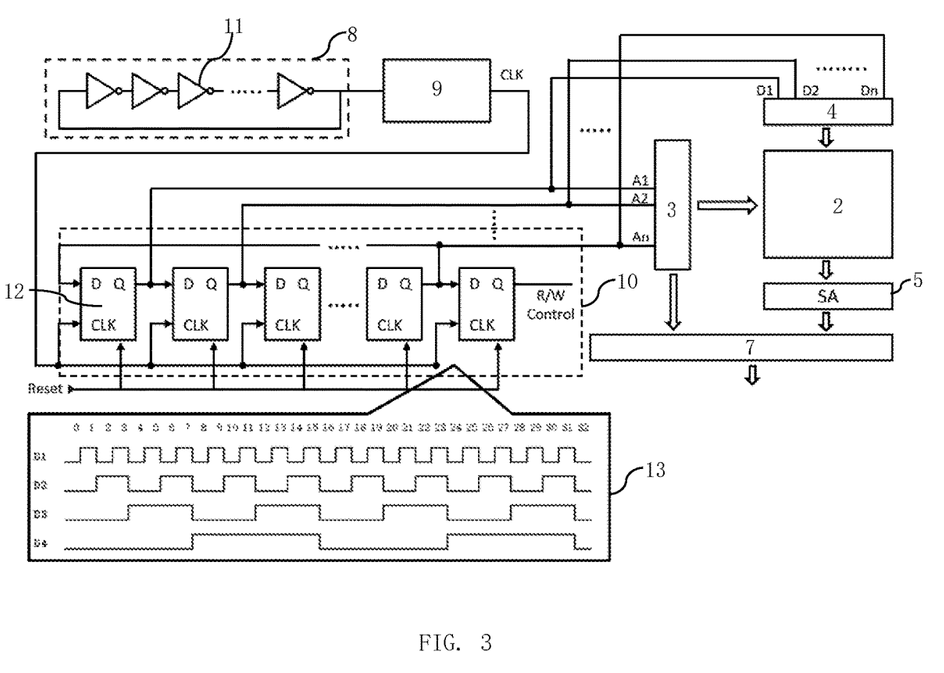
FIG. 3 is a structural diagram of a wafer acceptance test module for a static memory function test according to a preferred embodiment of the present disclosure.

As shown in FIG. 3, it is a structural diagram of a wafer acceptance test module for a static memory function test according to a preferred embodiment of the present disclosure. The preferred embodiment of the present disclosure is formed by means of further improvement on the basis of the embodiment of the present disclosure shown in FIG. 2. The preferred embodiment of the present disclosure also has the following features.

The ring oscillator 8 is formed by connecting an odd number of inverters 11 end to end.

The counter 10 is formed by connecting n+1 flip-flops 12, the output signals of the 1 to n-position flip-flops 12 form the n-bit count, and the output signal of the n+1-position flip-flop 12 forms the read-write control signal R/W Control.

The flip-flop 12 is a D flip-flop.

In FIG. 3, output signals of n flip-flops 12 respectively form n-bit said address, i.e., signals A1, A2 to An, to the address decoder 3, and n-bit data, i.e., signals D1, D2 to Dn to the data input port 4.

In FIG. 3, the signal diagram shown by reference numeral 13 shows the timing chart of the data output by the first four flip-flops 12, D1 is the output signal of the Q terminal of the first flip-flop 12, D2 is the output signal of the Q terminal of the second flip-flop 12, D3 is the output signal of the Q terminal of the third flip-flop 12, and D4 is the output signal of the Q terminal of the fourth flip-flop 12. It can be seen that the cycles of signals D1 to D4 are doubled successively, with the signal D1 as the lowest bit and the signal D4 as the highest bit, then the signals D1 to D4 can indicate a total of 32 counts from 0 to 31, and then the count is 0 from 32.

When the output of the data latch and comparator 7 indicates that the output signal of the address decoder 3 and the output signal of the sense amplifier 5 are the same, the test result is successful; when the output of the data latch and comparator 7 indicates that the output signal of the address decoder 3 and the output signal of the sense amplifier 5 are different, the test result is failed.

When the output signal of the n+1-position flip-flop 12 is 0, the read-write control signal R/W Control is a write signal, a write operation is performed on the memory cell array 2 under the control of the write signal, and in the write operation, the count is gradually increased from 0 and the data corresponding to the count is sequentially written in the same address as the count.

When the output signal of the n+1-position flip-flop 12 is 1, the read-write control signal R/W Control is a read signal, a read operation is performed on the memory cell array 2 under the control of the read signal, and in the read operation, the count is gradually increased from 0 and data in the same address as the count is sequentially read by the sense amplifier 5.

The number of memory cells in the memory cell array 2 is less than or equal to $2^n$.

Figure 4:
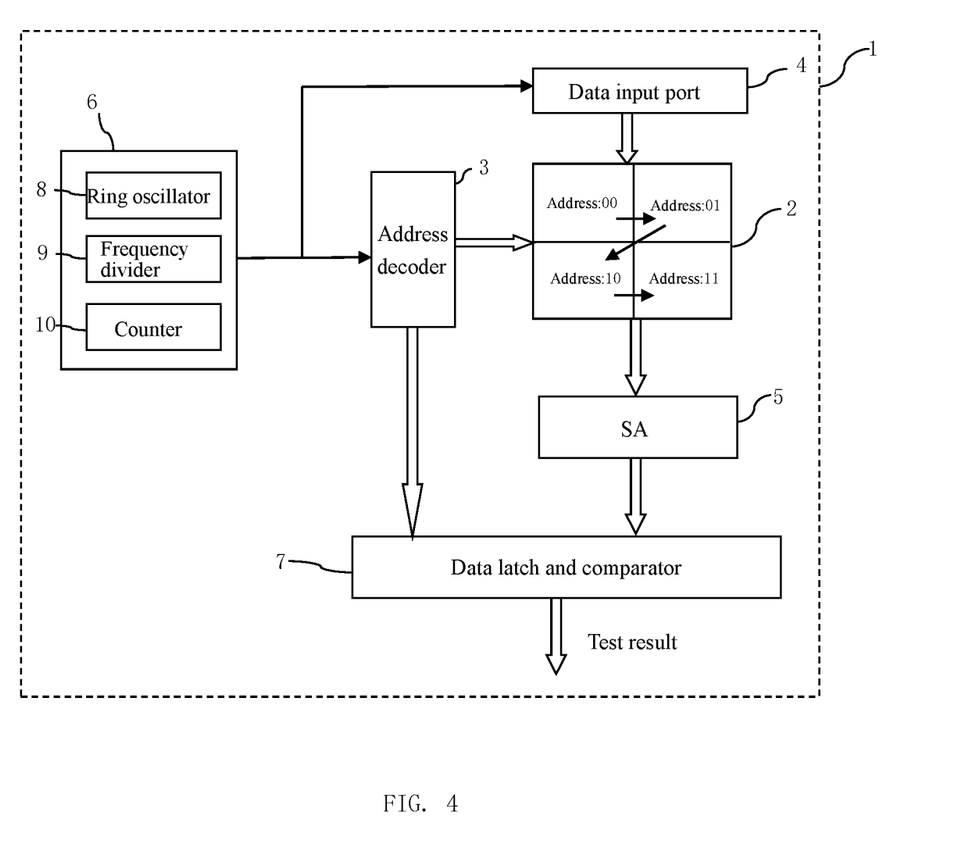
FIG. 4 is a schematic diagram of read-write control of a wafer acceptance test module for a static memory function test according to a preferred embodiment of the present disclosure.

As shown in FIG. 4, it is a schematic diagram of read-write control of a wafer acceptance test module for a static memory function test according to a preferred embodiment of the present disclosure. In the circuit structure diagram in FIG. 4, the modular structure shown in FIG. 2 is still used. In FIG. 4, the situation in which n=2 and the memory cell array 2 includes 4 memory cells is taken as an example for description.

Since n=2, a total of $2^{(n+1)}$, i.e., 8, clock cycles are required for the test of all the memory cells in the memory cell array 2, the address is a 2-bit address with a total of 4; and the data also has 4 values. As shown in Table 1 below, the first to fourth clock cycles are all for write operation, and the operation sequence is: starting from address 00, the next address being address 01, the further next address being address 10, and the last address being address 11. The sequence of the write operation is indicated by arrows in FIG. 4, and the data written in each address corresponds to the addresses.

The 5th to 8th clock cycles are for read operations, and the sequence of the read operation is the same as that of the write operation sequence.

As can be seen from the above, when the test shown in Table 1 is achieved, the counter 10 needs to use a total of three the flip-flops 12, and the first two flip-flops 12 are used to output the count and successively output four addresses from 00 to 11 and values required for data; the output signal of the third flip-flop 12 is used as the read/write control signal R/W Control. When the output signal of the third flip-flop 12 is 0, the write operation is realized; and when the output signal of the third flip-flop 12 is 1, a read operation is realized.

The reduced instruction built-in self-test circuit includes a ring oscillator 8, a frequency divider 9, a counter 10, and a data latch and comparator 7. The circuit structure consisting of the ring oscillator 8, the frequency divider 9 and the counter 10 is indicated by the reference numeral 6 alone.

The reduced instruction built-in self-test circuit works under DC voltage provided by wafer acceptance test equipment.

The ring oscillator 8 and the frequency divider 9 are used to form an internal clock signal CLK.

The counter 10 is used for count for the internal clock signal CLK, and the count is used as input signals of the address decoder 3 and the data input port 4 at the same time; and the most significant bit of the counter 10 is used as a read-write control signal R/W Control.

TABLE I

| Clock cycle | Address | Operation | Data |
| --- | --- | --- | --- |
| 1 | 00 | Write | 00 |
| 2 | 01 | Write | 01 |
| 3 | 10 | Write | 10 |
| 4 | 11 | Write | 11 |
| 5 | 00 | Read | 00 |
| 6 | 01 | Read | 01 |
| 7 | 10 | Read | 10 |
| 8 | 11 | Read | 11 |

The wafer acceptance test method for a static memory function test according to the embodiment of the present disclosure includes: during the manufacturing process of wafer 1, when a static memory is formed on the wafer 1, a step of forming a wafer acceptance test module on the wafer 1 is further included, the wafer acceptance test module includes a reduced instruction built-in self-test circuit formed on the wafer 1 and consisting of test patterns, and the reduced instruction built-in self-test circuit is for performing a function test for a static memory.

As shown in FIG. 2, the static memory includes a memory cell array 2, an address decoder 3, a data input port 4, and a sense amplifier 5.

The reduced instruction built-in self-test circuit includes a ring oscillator 8, a frequency divider 9, a counter 10, and a data latch and comparator 7. The circuit structure consisting of the ring oscillator 8, the frequency divider 9 and the counter 10 is indicated by the reference numeral 6 alone.

The reduced instruction built-in self-test circuit works under DC voltage provided by wafer acceptance test equipment.

The ring oscillator 8 and the frequency divider 9 are used to form an internal clock signal CLK.

The counter 10 is used for count for the internal clock signal CLK, and the count is used as input signals of the address decoder 3 and the data input port 4 at the same time; and the most significant bit of the counter 10 is used as a read-write control signal R/W Control.

The data latch and comparator 7 is connected to the output terminal of the address decoder 3 and the output terminal of the sense amplifier 5. The data latch and comparator 7 is used for comparing the output signal of the address decoder 3 and the output signal of the sense amplifier 5 and determine whether the test result is successful based on the comparison result.

The method of the preferred embodiment of the present disclosure also has the following features.

The ring oscillator 8 is formed by connecting an odd number of inverters 11 end to end.

The counter 10 is formed by connecting n+1 flip-flops 12, the output signals of the 1 to n-position flip-flops 12 form the n-bit count, and the output signal of the n+1-position flip-flop 12 forms the read-write control signal R/W Control.

The flip-flop 12 is a D flip-flop.

In FIG. 3, the signal diagram shown by reference numeral 13 shows the timing chart of the data output by the first four flip-flops 12, D1 is the output signal of the Q terminal of the first flip-flop 12, D2 is the output signal of the Q terminal of the second flip-flop 12, D3 is the output signal of the Q terminal of the third flip-flop 12, and D4 is the output signal of the Q terminal of the fourth flip-flop 12. It can be seen that the cycles of signals D1 to D4 are doubled successively, with the signal D1 as the lowest bit and the signal D4 as the highest bit, then the signals D1 to D4 can indicate a total of 32 counts from 0 to 31, and then the count is 0 from 32.

When the output of the data latch and comparator 7 indicates that the output signal of the address decoder 3 and the output signal of the sense amplifier 5 are the same, the test result is successful; when the output of the data latch and comparator 7 indicates that the output signal of the address decoder 3 and the output signal of the sense amplifier 5 are different, the test result is failed.

When the output signal of the n+1-position flip-flop 12 is 0, the read-write control signal R/W Control is a write signal, a write operation is performed on the memory cell array 2 under the control of the write signal, and in the write operation, the count is gradually increased from 0 and the data corresponding to the count is sequentially written in the same address as the count.

When the output signal of the n+1-position flip-flop 12 is 1, the read-write control signal R/W Control is a read signal, a read operation is performed on the memory cell array 2 under the control of the read signal, and in the read operation, the count is gradually increased from 0 and data in the same address as the count is sequentially read by the sense amplifier 5.

The number of memory cells in the memory cell array 2 is less than or equal to $2^n$.

As shown in FIG. 4, it is a schematic diagram of read-write control of a wafer acceptance test module for a static memory function test according to a preferred embodiment of the present disclosure. In the circuit structure diagram in FIG. 4, the modular structure shown in FIG. 2 is still used.

In FIG. 4, the situation in which n=2 and the memory cell array 2 includes 4 memory cells is taken as an example for description.

Since n=2, a total of $2^{(n+1)}$, i.e., 8, clock cycles are required for the test of all the memory cells in the memory cell array 2, the address is a 2-bit address with a total of 4; and the data also has 4 values. As shown in Table 1 below, the first to fourth clock cycles are all for write operation, and the operation sequence is: starting from address 00, the next address being address 01, the further next address being address 10, and the last address being address 11. The sequence of the write operation is indicated by arrows in FIG. 4, and the data written in each address corresponds to the addresses.

The 5th to 8th clock cycles are for read operations, and the read operation sequence is the same as the write operation sequence.

As can be seen from the above, when the test shown in Table 1 is achieved, the counter 10 needs to use a total of three the flip-flops 12, and the first two flip-flops 12 are used to output the count and successively output four addresses from 00 to 11 and values required for data; the output signal of the third flip-flop 12 is used as the read/write control signal R/W Control. When the output signal of the third flip-flop 12 is 0, the write operation is realized; and when the output signal of the third flip-flop 12 is 1, a read operation is realized.

The reduced instruction built-in self-test circuit includes a ring oscillator 8, a frequency divider 9, a counter 10, and a data latch and comparator 7. The circuit structure consisting of the ring oscillator 8, the frequency divider 9 and the counter 10 is indicated by the reference numeral 6 alone.

The reduced instruction built-in self-test circuit works under DC voltage provided by wafer acceptance test equipment.

The ring oscillator 8 and the frequency divider 9 are used to form an internal clock signal CLK.

The counter 10 is used for count for the internal clock signal CLK, and the count is used as input signals of the address decoder 3 and the data input port 4 at the same time; and the most significant bit of the counter 10 is used as a read-write control signal R/W Control.

The present disclosure is described in detail by means of specific embodiments, but these are not intended to limit the present disclosure. Many variations and improvements can be made by those skilled in the art without departing from the principle of the present disclosure, and should also be regarded as the protection scope of the present disclosure.

What is claimed is:

1. A wafer acceptance test module for a static memory function test, wherein the wafer acceptance test module includes a reduced instruction built-in self-test circuit formed on a wafer and consisting of test patterns, and the reduced instruction built-in self-test circuit is configured for performing a function test for a static memory formed on the wafer;

the static memory includes a memory cell array, an address decoder, a data input port, and a sense amplifier;

the reduced instruction built-in self-test circuit includes a ring oscillator, a frequency divider, a counter, and a data latch and comparator;

the reduced instruction built-in self-test circuit works under a DC voltage provided by wafer acceptance test equipment;

the ring oscillator and the frequency divider are used to form an internal clock signal;

the counter is used for count for the internal clock signal, and the count is used as input signal of each of the address decoder and the data input port; and a most significant bit of the counter is used as a read-write control signal;

the data latch and comparator is connected to an output terminal of the address decoder and an output terminal of the sense amplifier, and the data latch and comparator is used for comparing an output signal of the address decoder and an output signal of the sense amplifier and determine whether a test result is successful based on a comparison result;

wherein the counter is formed by connecting n+1 flip-flops, output signals of 1 to n-position flip-flops form an n-bit count, and an output signal of n+1 position flip-flop forms the read-write control signal;

wherein when the output signal of the n+1 position flip-flop is 0, the read-write control signal is a write signal, a write operation is performed on the memory cell array under the control of the write signal, and in the write operation, the count is gradually increased from 0 and data corresponding to the count is sequentially written in a same as the count, and wherein when the output signal of the n+1 position flip-flop is 1, the read-write control signal is a read signal, a read operation is performed on the memory cell array under the control of the read signal, and in the read operation, the count is gradually increased from 0 and the data in the same address as the count is sequantially read by the sense amplifier.

2. The wafer acceptance test module for the static memory function test according to claim 1, wherein the ring oscillator is formed by connecting an odd number of inverters end to end.

3. The wafer acceptance test module for the static memory function test according to claim 1, wherein each flip-flop is a D flip-flop.

4. The wafer acceptance test module for the static memory function test according to claim 1, wherein when the output of the data latch and comparator indicates that the output signal of the address decoder and the output signal of the sense amplifier are the same, the test result is successful; and when the output of the data latch and comparator indicates that the output signal of the address decoder and the output signal of the sense amplifier are not the same, the test result is failed.

5. The wafer acceptance test module for the static memory function test according to claim 1, wherein a number of memory cells in the memory cell array is less than or equal to $2^n$.

6. A wafer acceptance test method for a static memory function test, wherein during a wafer manufacturing process, when a static memory is formed on a wafer, a step of forming a wafer acceptance test module on the wafer is further included, the wafer acceptance test module includes a reduced instruction built-in self-test circuit formed on the wafer and consisting of test patterns, and the reduced instruction built-in self-test circuit is configured for performing a function test for the static memory;

the static memory includes a memory cell array, an address decoder, a data input port, and a sense amplifier;

the reduced instruction built-in self-test circuit includes a ring oscillator, a frequency divider, a counter, and a data latch and comparator;

the reduced instruction built-in self-test circuit works under a DC voltage provided by wafer acceptance test equipment;

the ring oscillator and the frequency divider are used to form an internal clock signal;

the counter is used for count for the internal clock signal, and the count is used as input signal of each of the address decoder and the data input port; and a most significant bit of the counter is used as a read-write control signal;

the data latch and comparator is connected to an output terminal of the address decoder and an output terminal of the sense amplifier, and the data latch and comparator is used for comparing an output signal of the address decoder and an output signal of the sense amplifier and determine whether a test result is successful based on a comparison result;

wherein the counter is formed by connecting n+1 flip-flops, output signals of 1 to n-position flip-flops form an n-bit count, and an output signal of an n+1 position flip-flop forms the read-write control signal;

wherein when the output signal of the n+1 position flip-flop is 0, the read-write control signal is a write signal, a write operation is performed on the memory cell array under the control of the write signal, and in the write operation, the count is gradually increased from 0 and data corresponding to the count is sequentially written in a same address as the count; and wherein when the output signal of the n+1 position flip-flop is 1,the read-write control signal is a read signal, a read operation is performed on the memory cell array under the control of the read signal, and in the read operation, the count is gradually increased from 0 and the data in the same address as the count is sequentially read by the sense amplifier.

7. The wafer acceptance test method for the static memory function test according to claim 6, wherein the ring oscillator is formed by connecting an odd number of inverters end to end.

8. The wafer acceptance test method for the static memory function test according to claim 6, wherein each flip-flop is a D flip-flop.

9. The wafer acceptance test method for the static memory function test according to claim 6, wherein when the output of the data latch and comparator indicates the output signal of the address decoder and the output signal of the sense amplifier are the same, the test result is successful; and when the output of the data latch and comparator indicates the output signal of the address decoder and the output signal of the sense amplifier are not the same, the test result is failed.

* * * * *